United States Patent [19]

Muehling

[11] Patent Number: 4,677,526

[45] Date of Patent: Jun. 30, 1987

[54] PLASTIC PIN GRID ARRAY CHIP CARRIER

[75] Inventor: Richard Muehling, Cranston, R.I.

[73] Assignee: Augat Inc., Mansfield, Mass.

[21] Appl. No.: 585,010

[22] Filed: Mar. 1, 1984

[51] Int. Cl.$^4$ .............................................. H05K 7/20
[52] U.S. Cl. ............................... 361/386; 174/52 FP;
357/70; 357/81; 361/421
[58] Field of Search ............... 174/52 FP; 339/17 CF;
357/70, 81; 361/386, 388, 389, 395, 396, 421

[56] References Cited

U.S. PATENT DOCUMENTS

| | | | |
|---|---|---|---|
| 3,118,016 | 1/1964 | Stephenson, Jr. | 361/421 |
| 3,216,089 | 11/1965 | Dettman | 361/396 |
| 3,270,399 | 9/1966 | Ohntrap | 361/421 |
| 3,676,748 | 7/1972 | Kobayashi et al. | 361/421 |
| 3,762,039 | 10/1973 | Douglass et al. | 174/52 FP |
| 4,195,193 | 3/1980 | Grabb et al. | 361/421 |
| 4,342,069 | 7/1982 | Link | 361/395 |
| 4,393,581 | 7/1983 | Cherian | 339/17 CF |
| 4,513,355 | 4/1985 | Schroeder et al. | 339/17 CF |

OTHER PUBLICATIONS

Lin et al., "Power Hybrid Module", IBM Technical Disclosure Bulletin vol. 16, No. 11 pp. 3826–3827.

Primary Examiner—A. D. Pellinen
Assistant Examiner—Gregory P. Thompson
Attorney, Agent, or Firm—Weingarten, Schurgin, Gagnebin & Hayes

[57] ABSTRACT

A low cost injection-molded plastic pin grid array chip carrier is provided as an alternative to a ceramic pin grid array chip carrier, in which an electrically superior package is fabricated by supporting nested lead frames in the mold cavity at the centers of the lead frames through the provision of a central carrier for each of the nested lead frames, with the central carrier permitting a one shot molding process. In one embodiment the lead frames include square toroidal central carriers, with one set of nested lead frames being provided with offset leads such that all leads lie in the same plane in the package. Path resistance is lower than the ceramic pin grid array chip carrier because of the use of a copper lead frame as opposed to the sputtered tungsten used in ceramic packages. Interlead resistance is increased through the utilization of conical or pyramidal supports for the pins which lengthens the resistance paths between the leads. Due to the lower dielectric constant of plastic, the interlead capacitance is significantly reduced to permit higher speed operation and reduced cross-talk. The subject plastic pin grid array chip carrier is also electrically superior to a conventional glass epoxy package and can be produced at a fraction of the cost.

5 Claims, 17 Drawing Figures

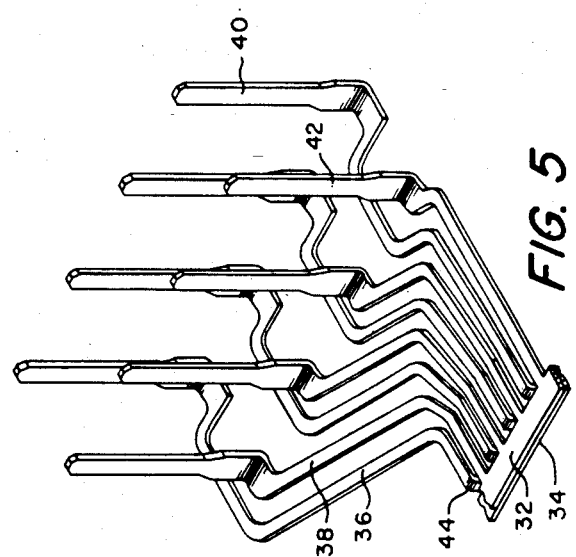
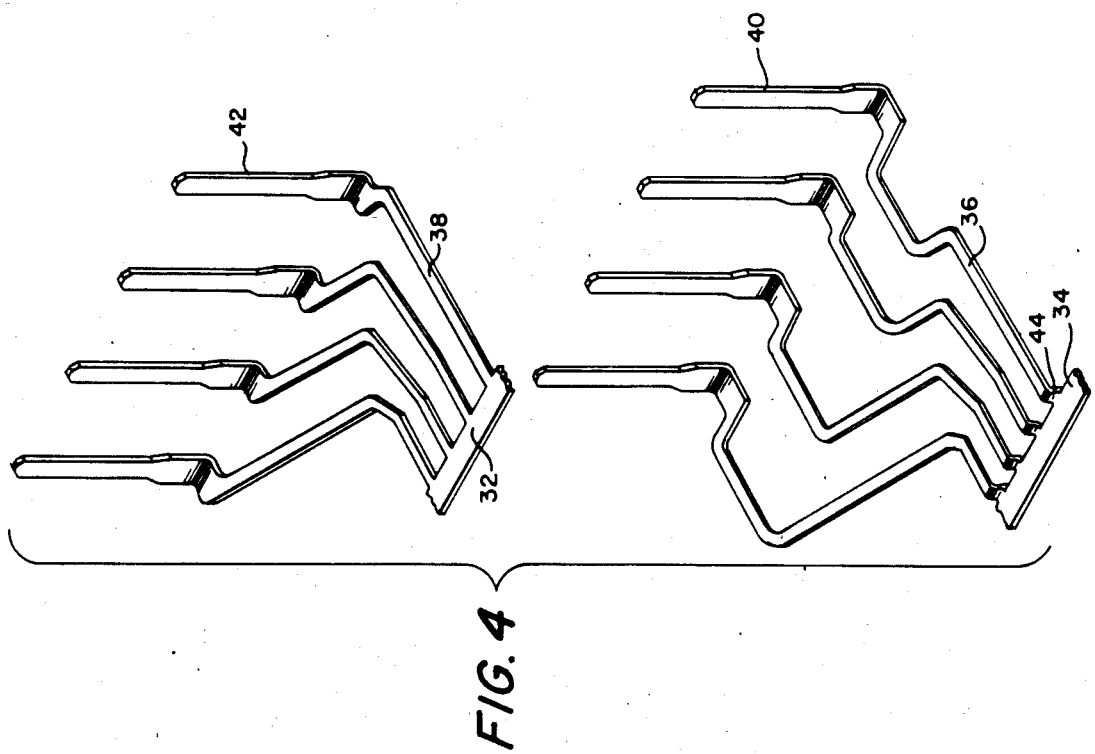

PLASTIC PIN GRID ARRAY CHIP CARRIER

FIELD OF THE INVENTION

This invention relates to packaging techniques for integrated circuits and more particularly to packaging technique for a pin grid array chip carrier.

BACKGROUND OF THE INVENTION

Plastic dual-in-line packages (DIPs) have been used extensively to house integrated circuits in which lead frames, supported by their edges, are supported in a mold cavity. The plastic is injected around the lead frames, with the ends of the leads extending laterally from the package. The package is provided with a central cavity into which an integrated circuit (IC) is mounted. The integrated circuit is typically wire bonded to contact pads at the ends of the traces which extend into the central cavity of the package and the package is then sealed by a cover. Thereafter, the leads are bent orthogonal to the plane of the package such that their ends define pins which extend at right angles to the package. While it is possible to have pins which completely surround the edge of this type of plastic package, it is not possible by this technique to provide an inwardly extending array of pins because the lead frames are supported by their edges during the molding process.

For very large scale integrated circuits (VLSICs) it is important that the number of leads be increased and, for this purpose, it is desirable to have an array of pins which extend orthogonal to the package and which are arranged inwardly either in concentric rings or rows to provide for double or triple the numbers of pins that could be provided by bent leads at the sides of the package. Thus, the conventional stamped lead frame approach cannot produce high pin count arrays because the lead frame is supported in the mold cavity at its edges.

In the past, in order to provide a pin grid array chip carrier, a ceramic package is provided in which a first level of tungsten leads or traces is patterned onto a ceramic base, with the exterior ends of the traces providing bonding pads to which are attached orthogonal copper alloy leads which are brazed to the bonding pads to form pins. An interior ring or row of leads is provided by overlying the ceramic base with another ceramic layer and patterning another layer of traces onto this layer, again with the traces having bonding pads at their ends. These ends lie inward of the outer ring of the bonding pads on the first layer. Orthogonal leads are then brazed or soldered to these bonding pads to provide the pin grid array. What will be appreciated is that not only are the pins not formed by a simple bending process but also there is a multilayer trace pattern in the ceramic package which is undesirable from the point of view that the bonding pads provided for the wire bonding of the chip are at different levels within the package. Moreover the brazed joint has an unpredictable path resistance which is undesirable.

By way of further background, glass epoxy pin grid array packages have been provided in which printed circuit boards are substituted for the layers of the ceramic package and in which round leads are soldered to the board to provide orthogonal pins, as opposed to the brazing in the ceramic package case. It should be noted in the glass epoxy version of the pin grid array chip carrier the circuit boards have a relatively thin two or three ounce copper trace which has been etched out of copper laminated to the glass epoxy substrate, with the thinness of the trace resulting in relatively high path resistance. Moreover, it should be noted that there is no lead frame in either the glass epoxy or ceramic versions.

It will be appreciated that what is desired is not a conventional dual-in-line package which has two rows of leads projecting from it at right angles to the plane of mounting to the chip, but rather what is desired is a pin grid array which can have as many as four or more concentric rings of pins.

The basic disadvantage to ceramic packaging is that it is expensive and that there are limitations in the control of tolerances because as larger packages are provided they are more and more difficult to fabricate. Also what occurs when providing ceramic packages is that with more and more pins, one cannot achieve a narrow enough tungsten lead without the path rsistance becoming so great that the integrated circuit will not function in the ceramic package provided, thus necessitating multiple layers.

Also, ceramic has a high dielectric constant, which is poor for two reasons. First, when using ceramic it becomes important to minimize the interconnection path length in the high dielectric constant media where the delay difference between it and a lower dielectric constant material can be a significant part of the delay in the circuit element. Emitter coupled logic (ECL) circuits with propagation delays of less than 1 ns are now available. If all interconnections were in alumina ceramic, the delay contribution of six inches of stripline interconnection would be a prohibitive 1.6 ns. If the same interconnection is provided in epoxy glass printed wiring the delay would still be a prohibitive 1.1 ns. Thus, the savings of one-half a circuit delay can be significant to some applications.

Secondly, due to the high dielectric constant of ceramic, the interlead capacitance is high, which results in low speed operation and considerable cross-talk problems.

From the manufacturing point of view, with respect to the conventional injection molding of dual-in-line packages, it will be appreciated that the leads are supported from opposing sides prior to molding. After the package has been molded the leads are bent down perpendicular to the package. However, in a pin grid array, more than two rows of pins or an inner ring of pins is required, which means that lead frames cannot be provided in the flat prior to the molding because the pins would be laying over one another.

In the prior art there are a number of techniques utilized to interconnect an integrated circuit that is already packaged. As such, the total package includes an intermediate connector which is used with an already packaged integrated circuit. These packaging techniques are cumbersome and expensive, and are used to adapt an already packaged die to a particualr pin configuration. One prior art technique is illustrated in U.S. Pat. No. 3,789,341 in which a plastic frame is used to encapsulate the leads. It will be appreciated that in this patent leads are bonded to a carrier to which the chip has already been attached and wire bonded. Here the integrated circuit is already bonded to a substrate and the interconnection means is thereafter provided. It will also be appreciated that the device in this patent is a dual-in-line device in which the leads do not come out on all four sides of the package.

With reference to U.S. Pat. No. 3,892,312, this particular patent refers to a one piece plastic molded carrier for a dual-in-line integrated circuit package or module which is again a packaging means for a device that has already been mounted. Moreover, this patent also refers to a dual-in-line device and not one which has leads perpendicular to the package on all four sides. Additionally, multiple rows are not taught in this patent. It should be noted that one of the principal objects of the above patent is to provide a dual-in-line package carrier in which the integrated circuit module may be inserted and held without imposing any such pressure or stress upon the leads thereof as might damage or completely destroy the operative integrity of the module. This means that an interconnection device is provided which includes a makeable and breakable interconnection between the module and the package. In essence, what is provided in this patent is a chip carrier which in turn is socketed or mounted to a board so that a second interconnection device is interposed. It will also be appreciated from the above two patents that the leads for the dual-in-line package are bent after manufacture into a position normal to the mounting plane.

Reference is also made to U.S. Pat. No. 4,195,193, in which the package described refers to a plastic chip carrier. Again in this patent the leads are bent in a position normal to the seating plane after the molding of the package. Additionally, only one layer and one row can be provided around the perimeter of the package due to the fact that the leads all exit the package at the side. While there are leads on all four sides, only one ring of pins can be provided. It will be appreciated that the package of this patent is intended to be a surface mount package, which is to say that the leads are not left at right angles to the package but rather are curled around so that they can be attached directly to the surface of the board. This precludes the use of this package where pins are required to project into plated thru-holes in a printed circuit board or to pass into a conventional IC socket. In leadless surface mount packaging, pads must be placed around the perimeter of the package which means that as the package pin count increases, the leadless package must increase in circumference to accommodate the increase in leads. This is in contradistinction to the pin grid array package which requires holes in a circuit board to which it is soldered. However, the major distinction is that in a pin grid package the rows can be increased in a pin grid array moving inwardly from the periphery of the package so that more input-output (IO) terminals or leads can be provided for a smaller surface area. Another problem with surface mount devices is the differential in thermal coefficient of expansion between the surface mounted package and the board. Because of the direct soldering of the contact pad to pads on the printed circuit board, considerable stress on these joints can result.

Other patents relating to lead frames and plastic encapsulation include U.S. Pat. Nos. 3,391,382, 3,652,974, 3,678,385, 3,930,115, 3,963,315, 4,026,412, 4,144,648, 4,252,864, 4,329,642, 4,358,173, and 4,387,388. In all of these additional patents their fabrication presumes lead frames which are edge supported as opposed to the center supported method of manufacture described hereinafter.

SUMMARY OF THE INVENTION

In contradistinction to the edge supported lead frames of the prior art, the subject invention includes a process involving one shot molding about nested lead frames which have their ends bent orthogonal to the finally molded package prior to molding. In the subject system, the nested lead frames are supported centrally in the mold cavity, as opposed to being edge supported. This permits one shot plastic molding of the pin grid array package. In one embodiment, two sets of lead frames are nested or interdigitated from square torodial shaped central carriers which are stacked one on top of the other. Leads extend outwardly from the central carriers, with one set of leads being offset to the plane of the other set of leads so that, in one embodiment, the leads extending outwardly from the centrally supporting toruses are interdigitated in one plane. Thereafter the ends of all of the leads are bent orthogonal to their originally supported plane so as to provide an array of pins in which an inner square array of pins is provided interiorally of an outer square array of pins. Having formed such a nested centrally supported lead frame arrangement, the lead frame pins are inserted into corresponding conical or pyramidal shaped orifices in the mold cavity such that the pins extend from the mold cavity, with the conical or pyramidal shaped orifices guiding the pins. The mold cavity is configured such that injected material is prevented from entering a central region which is larger than the central carriers. Thereafter the mold cavity is closed, and a one shot injection molding operation follows, using a low dielectric constant material such as plastic. The result is a package in which the pins extend perpendicular to the package from pyramids or cones, with a central region of the package being devoid of plastic to provide a central cavity. After molding, the aforementioned toroidal carriers are centered in this cavity with portions of the leads from the carriers extending into the plastic package thus formed. The toroidal carriers and leads are then cut off at the perimeter of the cavity. This leaves interdigitated bonding pads for a chip to be mounted in the central cavity, in which the bonding pads, in one embodiment, lie in one plane. Thereafter a heat sink is bonded to one side of the central cavity, and a die, in the form of an integrated circuit chip, is attached to the heat sink. After the die is in place on the heat sink, it is wire bonded to the aforementioned pads in a conventional manner and a top cover is then sealed over the central cavity to complete the package. While plastic cannot provide for a hermetic seal, the sealing may be done in such a way that the package has a pseudohermeticity i.e. provide a practicable sealing action. This is accomplished through the utilization of certain epoxies and/or ultrasonic welding techniques in which plastic reflow occurs.

Not only is a pin grid array chip carrier produced in a one shot process but also the path resistance for the relatively thick copper alloy leads is dramatically reduced over the relatively thin patterned leads for the ceramic and glass packages. Moreover, the resistance paths between leads is increased due to the conical or pyramid type structures which support the pins to reduce cross-talk. The use of the low dielectric constant plastic reduces the delay to less than one nanosecond and also decreases cross-talk, which has been so severe with ceramic systems that grounded interdigitated leads have been used to decrease cross-talk in the prior art ceramic packages.

BRIEF DESCRIPTION OF THE DRAWINGS

These and other features of the subject invention will be better understood in connection with the detailed description taken in conjunction with the drawings of which:

FIG. 4 is a diagrammatic illustration of portions of the two sets of lead frames prior to the stacking thereof;

FIG. 5 is a diagrammatic illustration of the stacking of the portions of the lead frames of FIG. 4, illustrating the offset of the lead frames for the underneath carrier;

DETAILED DESCRIPTION OF THE DRAWINGS

Figure 1:
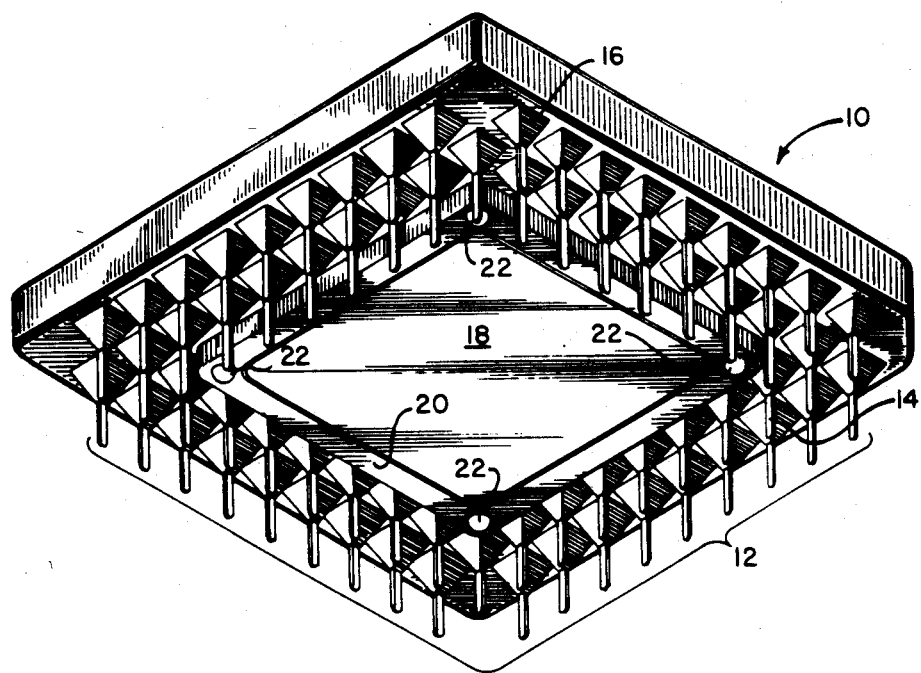
FIG. 1 is a perspective view of the bottom of the subject molded plastaic pin grid array chip carrier package with a cap or cover in place.

Referring to FIG. 1, in one embodiment of a shot molded plastic pin grid array or package 10 is illustrated in which an outer ring 12 of pins surrounds an inner ring 14 of pins, with each of the pins projecting from a tapered projection 16 in the form of a pyramidal integral support structure. The package is provided with a cover 18 and a rim 20 having standoffs 22 positioned thereon.

Figure 2:
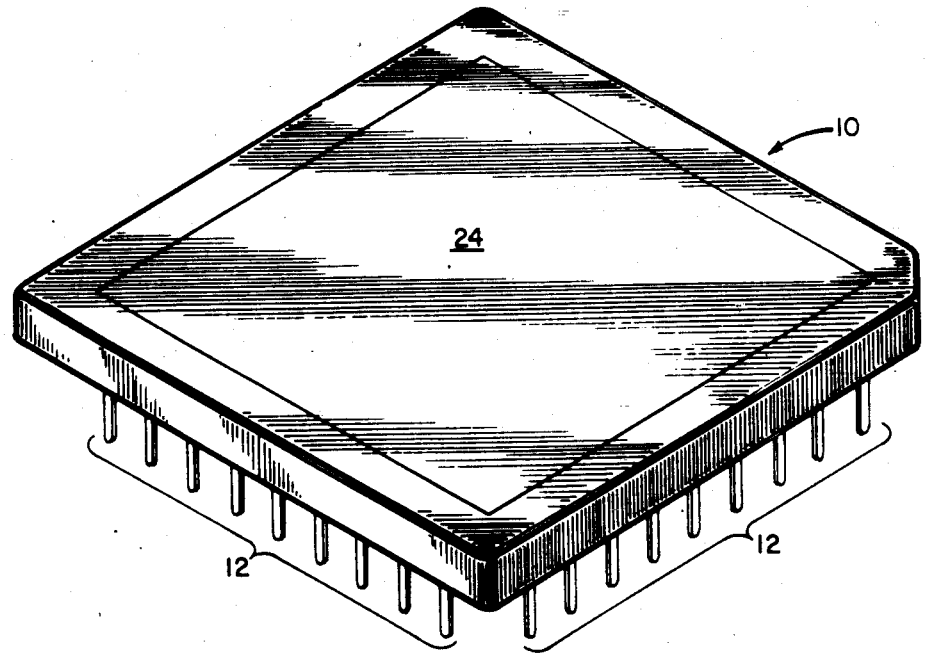
FIG. 2 is a perspective view of the top of the package of FIG. 1 showing the heat sink sealed to the package.

Referring to FIG. 2, the package of FIG. 1 is shown inverted, with the top of the package having an inlaid heat sink 24 secured to the package.

Figure 3:
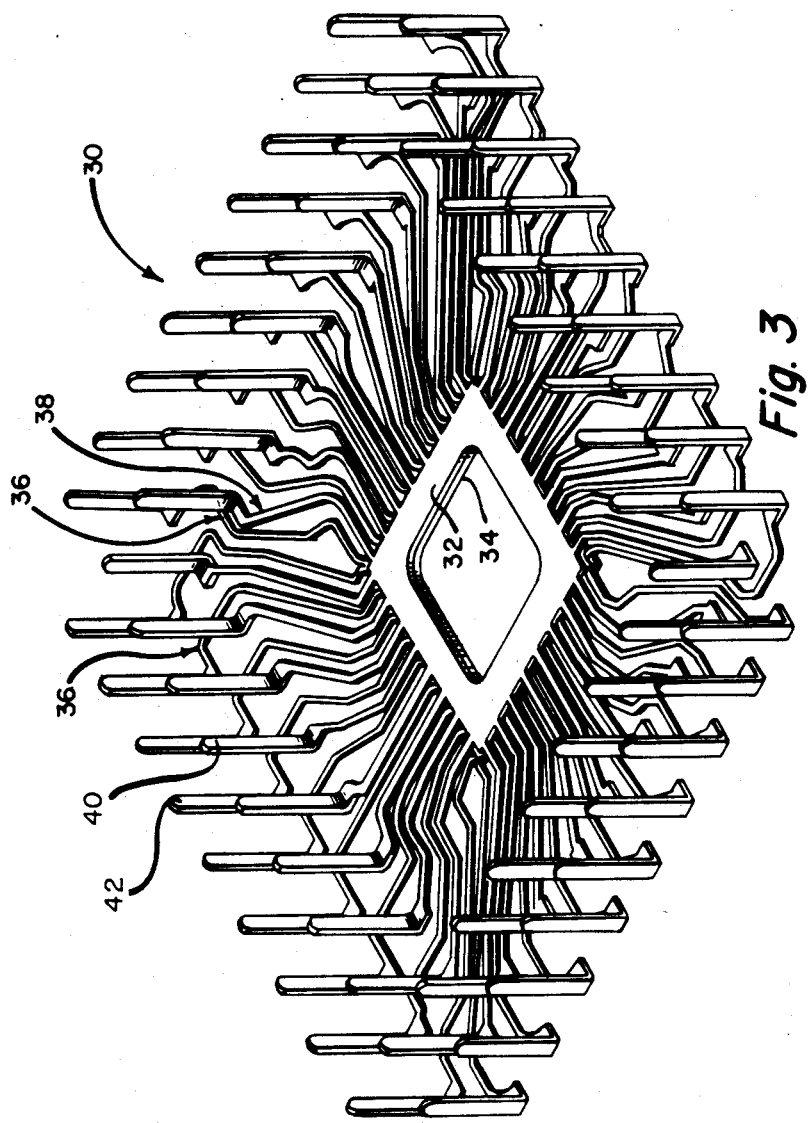
FIG. 3 is a diagrammatic illustration of the interdigitated, centrally supported lead frames showing the central toroidally-shaped, stacked carriers and the bent leads which form the pins of the subject pin grid array.

In order to provide the pin grid array of FIG. 1, and referring now to FIG. 3, in one embodiment, prior to molding, a centrally supported lead frame stucture 30 is provided with toroidally shaped central carriers 32 and 34 which are stacked one on top of the other. Leads 36 and 38 extend from each of these carriers, with leads 36 and 38 being interdigitated as shown. As can be seen, the leads from carrier 34 are offset upwardly so that the plane in which leads 36 lie is the same plane in which leads 38 lie. Ends 40 and 42 of leads 36 and 38, are bent orthogonal to the plane of the leads to provide pins. The bending occurs prior to the molding process which will be discussed hereinafter.

Referring to FIG. 4, portions of the lead frames of FIG. 3 are shown prior to stacking in which leads 38 are not offset from the plane of carrier 32, whereas the leads 36 are offset at 44 from carrier 34 as illustrated.

Referring to FIG. 5, offset 44 provides that leads 36 are in the same plane as leads 38 when carrier 32 is stacked on top of carrier 34.

Figure 6:
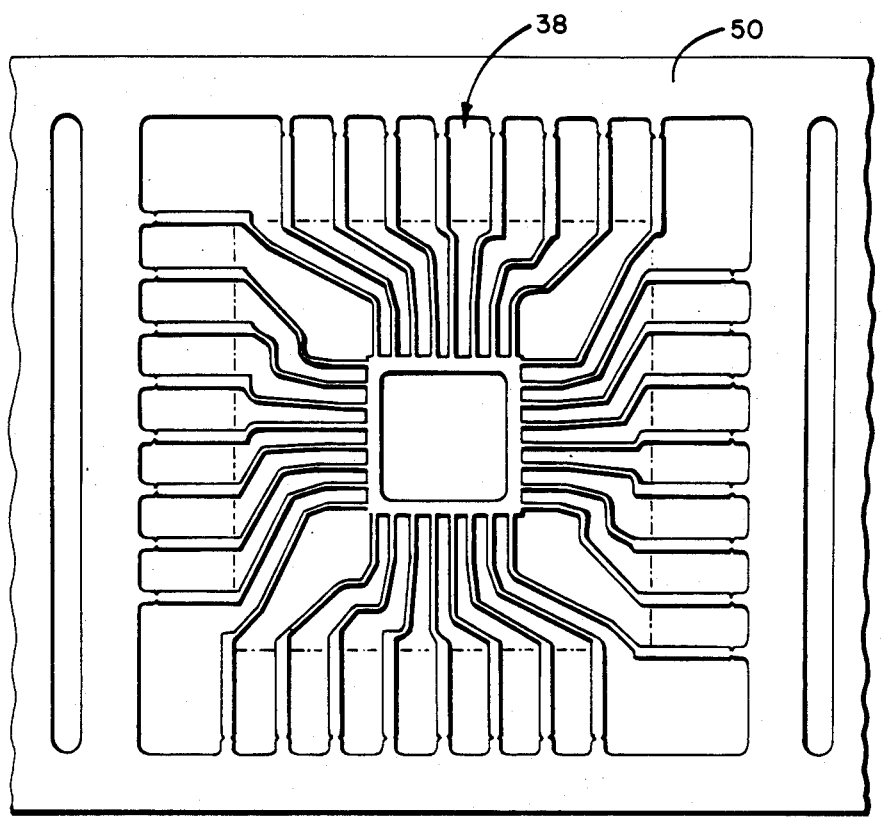
FIG. 6 is a top view of the stamping utilized for the fabrication of the topmost of the lead frames of FIG. 3.
Figure 7:
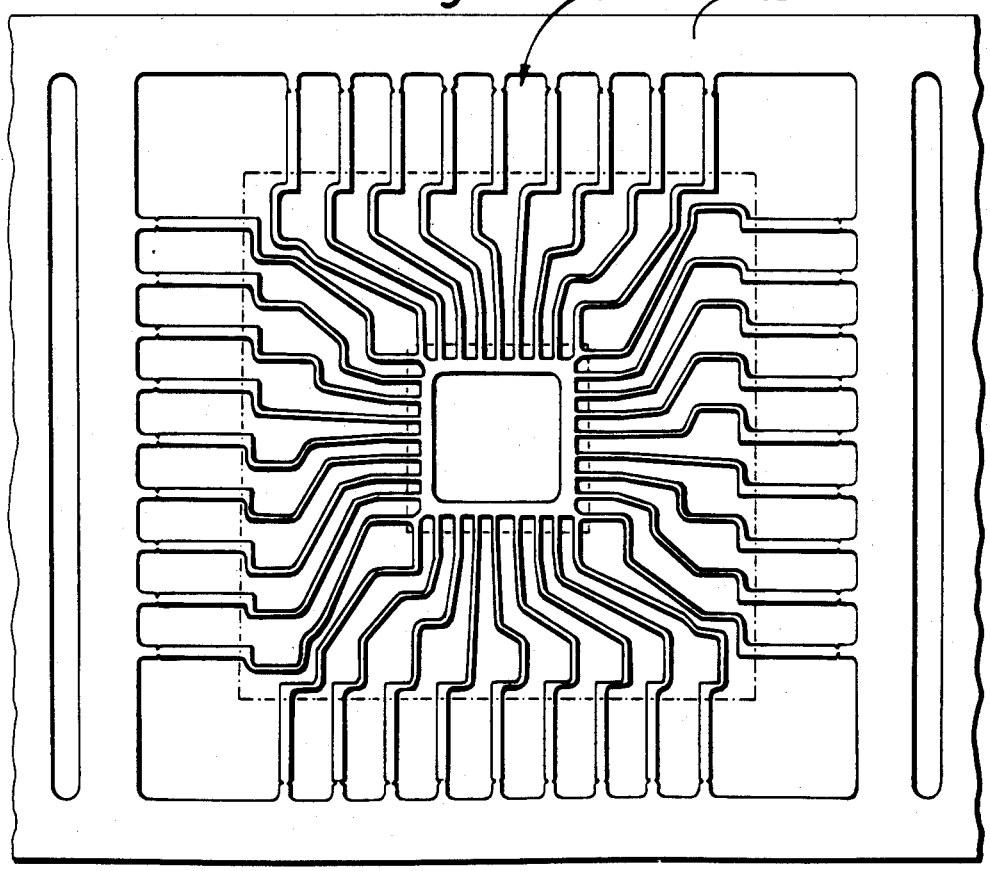
FIG. 7 is a top view of the stamping for the lead frames for the bottommost of the lead frames of the FIG. 3.

Referring to FIG. 6, the topmost lead frame is initially stamped so that it is held by an external carrier 50, whereas in FIG. 7 the bottommost lead frame is originally stamped such that it is supported by an external carrier 52.

Figure 8:
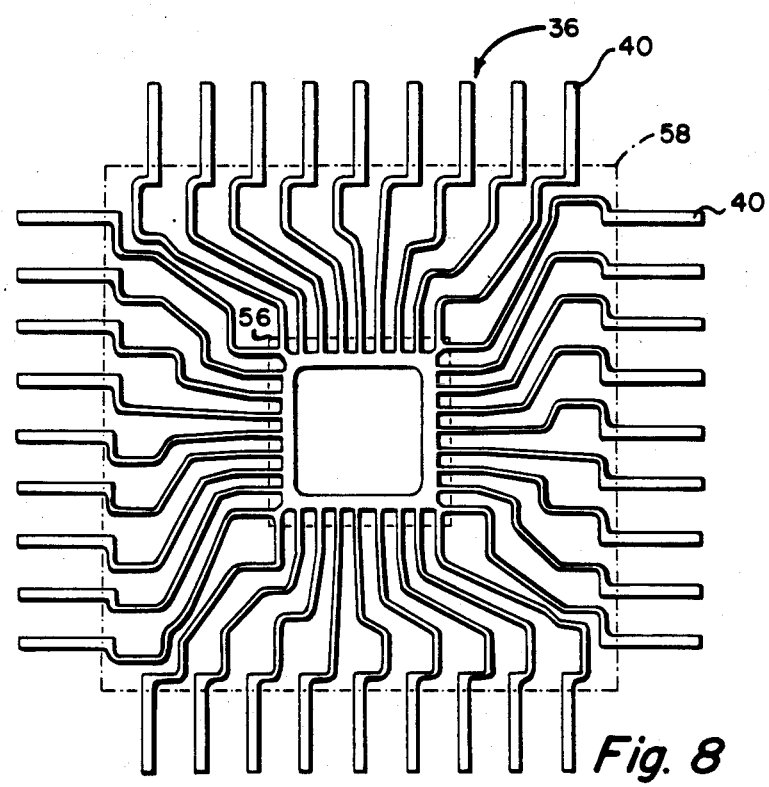
FIG. 8 is a top view of the lead frame of FIG. 7, with the external carrier removed.

Referring to FIG. 8, the bottommost lead frame has exterior carrier 52 cut off and thereafter has its leads bent at the position illustrated by dotted line 56 to provide the required offset.

Figure 9:
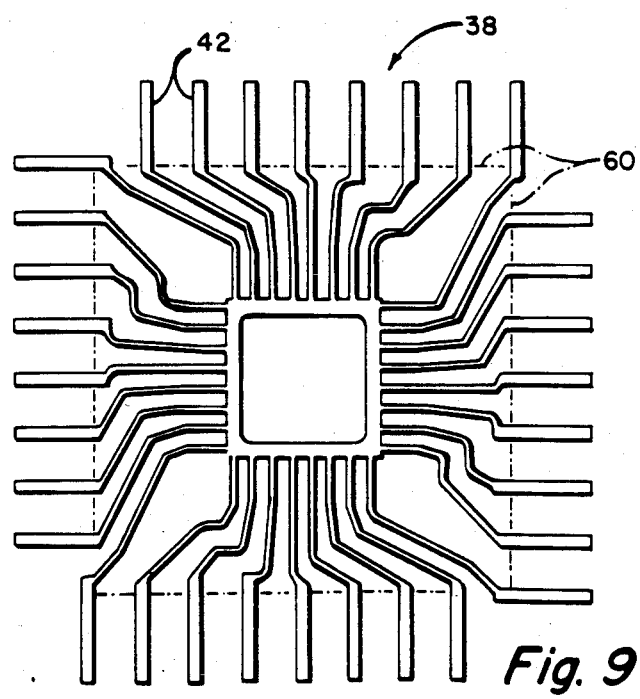
FIG. 9 is a top view of the lead frame of FIG. 6 with the external carrier removed.

Referring to FIG. 9, the topmost lead frame is cut away from its associated carrier. In FIGS. 8 and 9 ends 40 of lead frame 36 are bent upwardly about dotted lines 58, whereas ends 42 of lead frame 38 are bent upwardly about dotted lines 60 such that upon stacking of these two lead frames, the structure of FIG. 3 is achieved.

Figure 10:
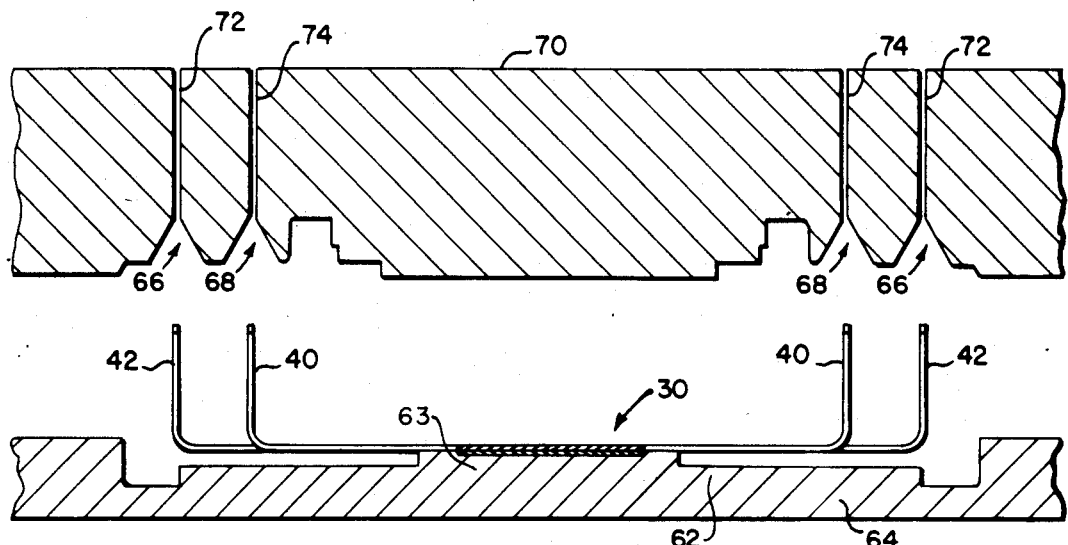
FIG. 10 is a cross-sectional and diagrammatic illustration of the mounting of the stacked lead frames in a mold cavity over a central pilot pin or projection, illustrating the tapered channels in the cavity to receive the pins from the lead frames.

Referring now to FIG. 10, the stacked lead frame structure 30 of FIG. 3 is mounted on a support 62 and over a central chamfered pilot pin or projection 63 within the bottom half 64 of the mold cavity such that lead ends 42 project into tapered or chamfered slots 66, whereas lead ends 40 project into chamfered slots 68. Chamfered slots 66 and 68 are formed in the top half 70 of the mold cavity, with the chamfer being provided either by conical indentations or by pyramidal chamfers. Channels 66 and 68 are provided with channel extensions 72 and 74, respectively, which accommodate ends 42 and 40, respectively when the top half of the mold cavity is brought down over the bottom half. Alternatively, slots may be provided in both mold cavity halves so that pins extend from the package in opposite directions.

Figure 11:
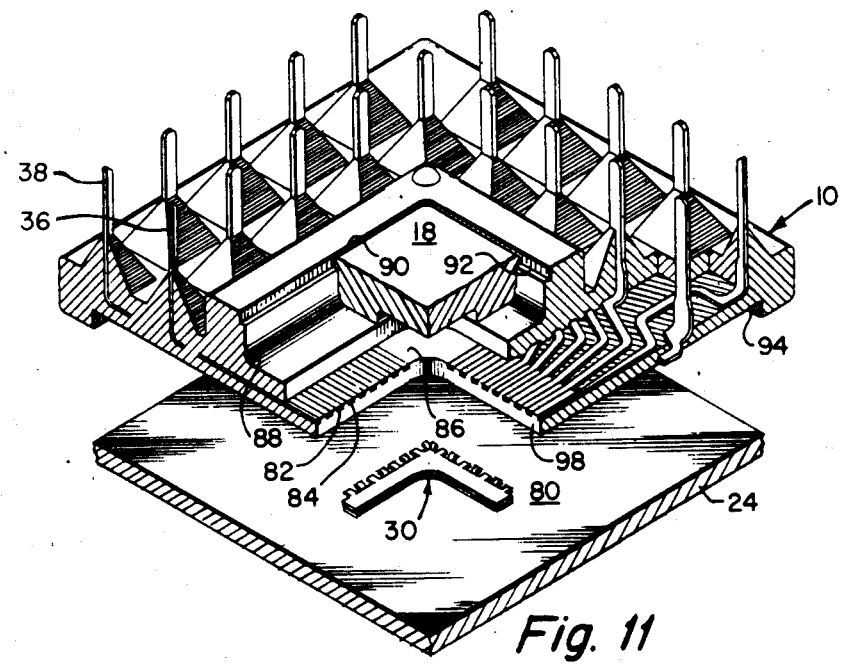
FIG. 11 is an exploded and diagrammatic view of the package produced by the molding operation of FIG. 10, illustrating the position of a heat sink, the cut-off central carrier and the cover with respect to the one shot molded article.

Referring to FIG. 11, the result of the one shot injection molding associated with FIG. 10 is a unitary package housing having a central interior aperture 80, with leads 36 and 38 having exposed ends 82 and 84 on a lip 86 with ends defining contact pads for the die to be mounted within aperture 80. The molding produces a recess 88 to one side of aperture 80 on which cover or cap 18 rests, with the outer periphery 90 of cover 18 being provided with a lip which rests on a recess 92 in the package housing. Heat sink 24 is mounted in a recess 94 in housing 10 to an opposite side of aperture 80, with the toroidally shaped central carrier 30 having been cut off at the periphery 98 of aperture 80 as illustrated.

The heat sink 24 is of a high thermal conductivity and may be made of copper or aluminum, with the heat sink being bonded to recess 94 by ultrasonically reflowing the plastic or using an adhesive, whereas cover 18 is made of the same type of plastic as the package and is bonded to ledge 92 by ultrasonic welding which results in plastic reflow for a pseudohermetic seal.

Figure 12:
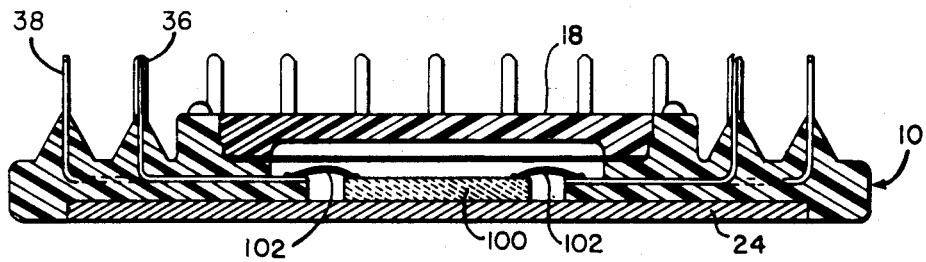
FIG. 12 is a cross-sectional and diagrammatic view of a portion of the package of FIG. 11 showing a die resting on the heat sink, with the die being wire bonded to contact pads at the ends of the leads of the lead frames in the package.

Thereafter, as illustrated in FIG. 12, a die 100 is wire bonded by wires 102 to contact pads 82 and 84 as illustrated. As can be seen the die is mounted on heat sink 24, with package 10 then being provided with cover 18 to seal the package.

Figure 13:
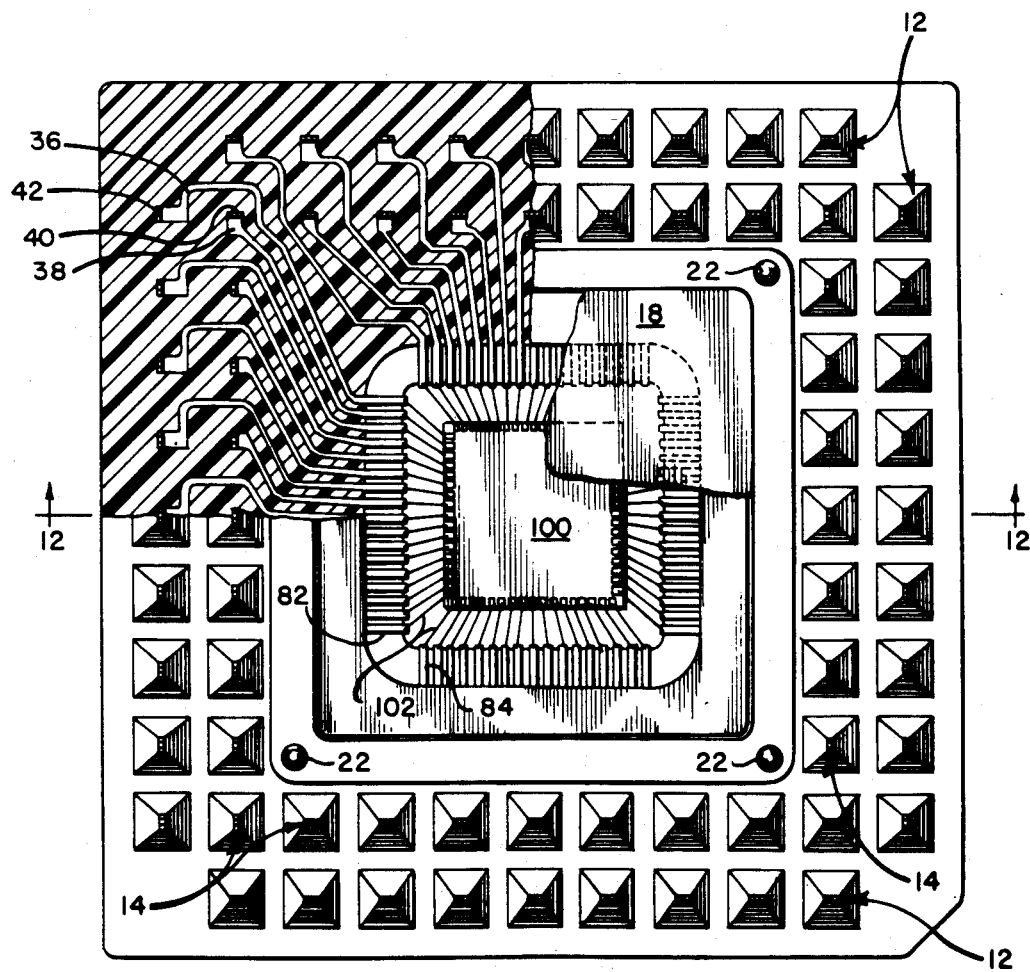
FIG. 13 is a partial sectional view of the package of FIG. 12 taken from the bottom of the package, illustrating the wire bonding of the die to contact pads at the ends of various lead frames as well as the interdigitated lead frame structure.

Referring to FIG. 13, the wire bonding of FIG. 12 can be seen from the top, with cover 18 partially removed. Here the interdigitation of the lead frames can be seen in a single plane to provide the outer square ring of the array 12 and the inner square ring of the array 14.

While what has been illustrated is a single plane for the lead frames within the package which provides an array with two concentric rings of pins, it will be appreciated that additional concentric rings of pins can be provided by multiple levels of lead frames and a multistep process. This process begins with the formation of the assembly illustrated in FIG. 12, absent the die, wire bonding and sealing. This assembly is illustrated in FIG. 14.

Figure 14:
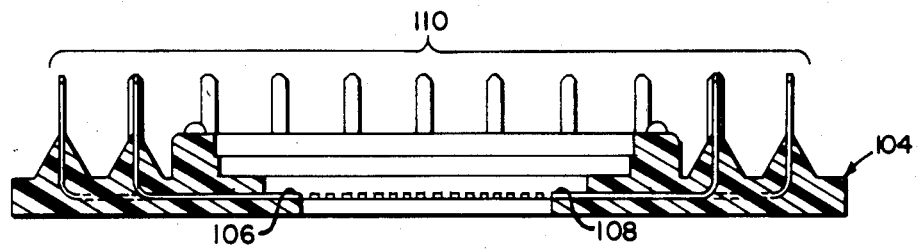
FIG. 14 is a cross-sectional and diagrammatic view of an assembly to be provided with an additional level of lead frames.

Assembly 104 of FIG. 14 is essentially the same as that of FIG. 12 with the exception that the heat sink pocket illustrated in FIG. 12 no longer exsits. This is a simple matter of changing the insert in the mold cavity used to produce the assembly. The reason for the removal of the heat sink pocket is so that the next level lead frame can be placed closely adjacent the first level lead frames. Assembly 104 is characterized as having a concentric array 110 of pins which are bent up from lead frames 106 and 108 which lie at one level or plane. Each of pins 110 is captured in plastic as before.

Figure 15:
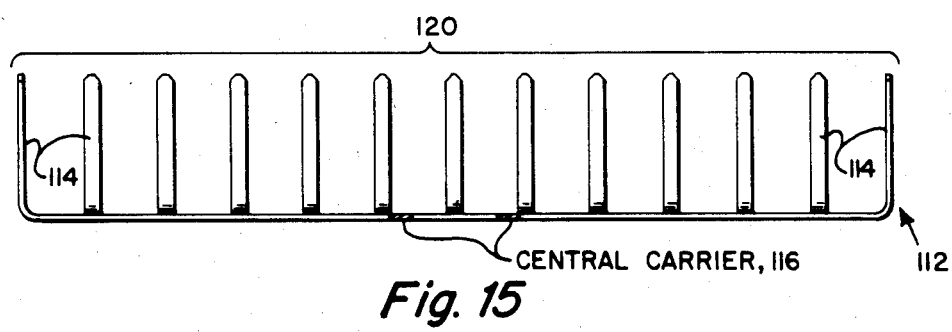
FIG. 15 is a diagrammatic view of the additional lead frame for use with the assembly of FIG. 14.
Figure 16:
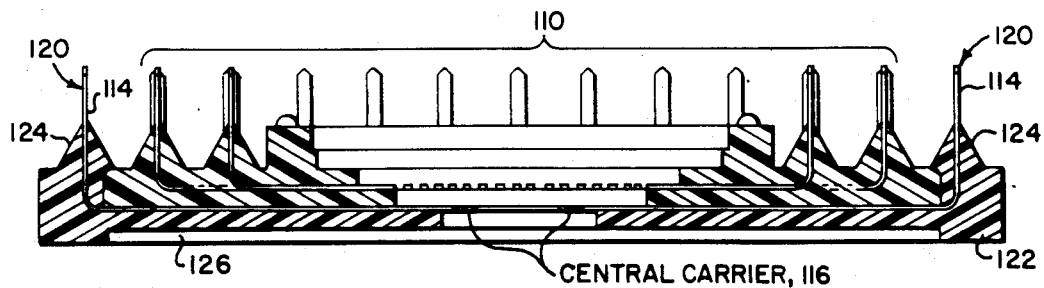
FIG. 16 is a cross-sectional and diagrammatic view of a multilevel lead frame pin grid array package absent heat sink and die.

Referring now to FIG. 15, it will be appreciated that the lead frame 112 pins 114 form an array 120 which encircles the pins associated with the first level lead frames such that increased array density is provided in a multistep process by adding to the perimeter of the device. Alternatively, the lead frames in the first level may be positioned closer to the center of the device such that by adding additional concentric rings the overall size of the device is not measurably increased. Again as before, the second level lead frame is centrally supported by a central carrier 116, here in ring or torus form. It will be appreciated that the subsequent level lead frames have a central carrier ring or torus which permits them to be supported from a central location, and to be positioned adjacent the already formed assembly as illustrated in FIG. 16. Once the additional lead frame is positioned adjacent the already formd structure of FIG. 14 in a mold cavity, an additional injection molding process proceeds such that the second level lead frame is encapsulated with plastic material 122 which bonds to the already formed plastic assembly 104 in such a manner that there is an attachment or bond between the injection molded material and the already molded plastic. Here pins 114 are surrounded by tapered plastic portions 124 for the same reasons as described for the single level lead frame package. It will be seen that pin array 120 lies outside of the previously formed pin array 110.

Figure 17:
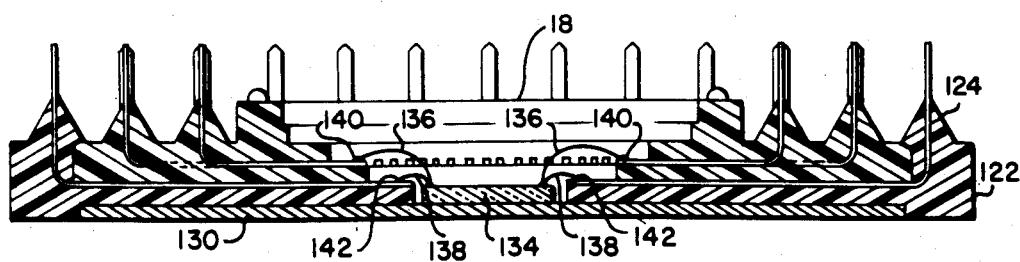
FIG. 17 is a cross-sectional and diagrammatic view of the multilevel package of FIG. 16 showing multilevel wire bonding.

Referring to FIG. 17, the assembly of FIG. 16 is provided with a heat sink 130 in the recess 126 provided therefore (FIG. 16) on which is mounted a die 134 which is wire bonded by wires 136 and 138 to bonding sites 140 and 142 at different levels.

As can be seen a further circumferential ring of pins is provided, thereby increasing the pin density of the array of FIG. 14. The structure of FIG. 17 also shows an additional ring of bond sites at a level different from that of the first ring of bond sites such that when the die is positioned on the heat sink, the contact pads on the die are wire bonded not only to the bond sites at the first level but also are wire bonded to the bond sites at the second level.

It will be appreciated that the plastic normally utilized, which has a low dielectric constant is polyphenelene sulfide, having a dielectric constant of 4.0, as opposed to ceramic dielectric constants of 6.5–10.0. Since, in one embodiment, the lead frames are made of copper, in which the thickness of the copper is 0.006 in., not only is the path resistance low, but the interlead resistance is high due to the pyramidal supports for the pins which increases the electrical path length from one exposed pin to the other. The low dielectric constant of the encapsulating material minimizes cross-talk.

It will be appreciated that more than two concentric rings of pins can be provided for the pin grid array, such that the subject invention is not limited by the number of rings utilized. Moreover, one of the important features of the subject invention is the central carrier which permits pin grid arrays to be fabricated in a one shot molding process, since the lead frames with bent pin ends are supported centrally from a carrier which is later removed. This provides an array in which the pins are bent prior to encapsulation. The subject method alleviates the problems of solder bonding or brazing pins to contact pads to provide a pin grid array and is both simple and economical.

Having above indicated a preferred embodiment of the present invention, it will occur to those skilled in the art that modifications and alternatives can be practiced within the spirit of the invention. It is accordingly intended to define the scope of the invention only as indicated in the following claims.

I claim:

1. A plastic pin grid array package comprising:
   molded pin receiving and support means including a peripheral plastic wall surrounding a central, generally-rectangular IC receiving aperture, said peripheral plastic wall having a first plurality of pin receiving and longitudinally-extending apertures disposed therethrough in a first, generally-rectangular pattern and further having a second plurality of pin receiving and longitudinally-extending apertures disposed therethrough in a second, generally-rectangular pattern;
   a first plurality of leads of a first lead frame corresponding in number to said first plurality of pin receiving apertures each having a first longitudinally-extending pin portion individually received in corresponding ones of said first apertures of said first, generally-rectangular pattern and each having a second portion, extending in a plane to which the first portion is generally perpendicular, towards and terminating at a preselected different terminal point spaced apart along the peripheral locus of the central, generally-rectangular IC receiving aperture;

a second plurality of leads of a second lead frame corresponding in number to said second plurality of pin receiving apertures each having a first longitudinally-extending pin portion individually received in a corresponding one of said second apertures of said second, generally-rectangular pattern and further having a second portion, extending in a plane to which the first portion is generally perpendicular, towards and terminating at a preselected different terminal point spaced apart along the peripheral locus of the central, generally-rectangular IC receiving aperture;

the plane in which the second portions of the first plurality of leads extend to a different preselected point spaced apart along the peripheral locus of the central generally-rectangular IC receiving aperture is generally the same plane as the plane in which the second portions of the second plurality of leads extend to a preselected different point spaced along the peripheral locus of the central generally-rectangular IC receiving aperture;

the preselected different terminal points at which the second portion of the first plurality of leads terminate being selected to symmetrically surround the central, generally-rectangular IC receiving aperture and the preselected different terminal points at which the second portions of the second plurality of leads terminate being selected to symmetrically surround the central, generally-rectangular IC receiving aperture.

2. The package of claim 1, wherein the preselected different terminal points of the second portions of the first plurality of leads and the preselected different terminal points of the second portions of the second plurality of leads are so selected that the terminal points of the second portions of the first and second pluralities of leads are interdigited symmetrically about the peripheral locus of the central, generally-rectangular IC receiving aperture.

3. The package of claim 1, further including first and second pluralities of tapered projections of plastic integral with said peripheral plastic wall of said moldable pin receiving and support means that individually surround corresponding ones of said first portions of said first and second pluralities of leads.

4. The package of claim 1, further including a heat sink to one side of said aperture, a die having contact pads that is mounted on said heat sink, means for electrically connecting each of said contact pads to preselected ones of said terminal points of said second portions of said first and second pluralities of leads, and a cover mounted to an opposing side of sid central aperture.

5. The package of claim 4, wherein said cover is plastic, and is ultrasonically bonded to said periheral plastic wall of said moldable pin receiving and support means.

* * * * *

UNITED STATES PATENT AND TRADEMARK OFFICE
CERTIFICATE OF CORRECTION

PATENT NO. : 4,677,526

DATED : June 30, 1987

INVENTOR(S) : Richard Muehling

It is certified that error appears in the above-identified patent and that said Letters Patent is hereby corrected as shown below:

Column 1, line 6, "to packaging" should read --to a packaging--

Column 2, line 18, "rsistance" should read --resistance--
line 58, "particualr" should read --particular--

Column 4, line 8, "torodial" should read --toroidal--

Column 5, line 8, "plastaic" should read --plastic--
line 64, "embodiment of a shot" should read --embodiment a one shot--

Column 6, line 53, "respectively" should read --respectively,--
line 62, "86 with" should read --86, with--

Column 7, line 57, "formd" should read --formed--

Column 8, line 3, "therefore" should read --therefor--

Column 10, line 24, "of sid" should read --of said--
line 27, "periheral" should read --peripheral--

Signed and Sealed this

Twenty-fifth Day of October, 1988

Attest:

DONALD J. QUIGG

Attesting Officer

Commissioner of Patents and Trademarks